United States Patent
Rhodes

(10) Patent No.: US 7,622,321 B2
(45) Date of Patent: Nov. 24, 2009

(54) HIGH DIELECTRIC CONSTANT SPACER FOR IMAGERS

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 11/483,202

(22) Filed: Jul. 10, 2006

(65) Prior Publication Data

US 2007/0018211 A1    Jan. 25, 2007

Related U.S. Application Data

(62) Division of application No. 10/865,762, filed on Jun. 14, 2004, now abandoned.

(51) Int. Cl.
 *H01L 21/336* (2006.01)

(52) U.S. Cl. .................. 438/60; 438/66; 438/75; 257/291; 257/222; 257/225; 257/E27.133

(58) Field of Classification Search ......... 257/291, 257/222, 225, E27.133; 438/60, 66, 75
See application file for complete search history.

(56) References Cited

U.S. PATENT DOCUMENTS

| | | | |
|---|---|---|---|
| 3,909,925 A * | 10/1975 | Forbes et al. | 438/587 |
| 4,700,459 A * | 10/1987 | Peek | 438/587 |
| 4,742,027 A * | 5/1988 | Blanchard et al. | 438/75 |
| 5,002,896 A * | 3/1991 | Naruke | 438/277 |
| 5,149,664 A * | 9/1992 | Shin et al. | 438/277 |
| 5,494,838 A * | 2/1996 | Chang et al. | 438/264 |
| 5,512,499 A * | 4/1996 | Cambou et al. | 438/179 |
| 5,698,883 A | 12/1997 | Rhodes | |
| 5,846,863 A * | 12/1998 | Lee et al. | 438/275 |
| 5,904,517 A * | 5/1999 | Gardner et al. | 438/197 |
| 6,023,081 A | 2/2000 | Drowley et al. | |
| 6,121,138 A * | 9/2000 | Wieczorek et al. | 438/682 |
| 6,140,630 A | 10/2000 | Rhodes | |
| 6,159,800 A * | 12/2000 | Liu et al. | 438/258 |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,448,592 B1 * | 9/2002 | Peek et al. | 257/215 |
| 6,504,196 B1 | 1/2003 | Rhodes | |
| 6,524,913 B1 * | 2/2003 | Lin et al. | 438/261 |
| 6,531,725 B2 | 3/2003 | Lee et al. | |
| 6,548,352 B1 * | 4/2003 | Rhodes | 438/257 |
| 6,849,516 B2 * | 2/2005 | Feudel et al. | 438/303 |
| 6,869,817 B2 | 3/2005 | Hwang | |
| 2001/0020723 A1 * | 9/2001 | Gardner et al. | 257/368 |
| 2001/0032988 A1 | 10/2001 | Yoshida et al. | |
| 2001/0039068 A1 | 11/2001 | Lee et al. | |
| 2003/0030083 A1 | 2/2003 | Lee et al. | |
| 2004/0089883 A1 | 5/2004 | Kim | |
| 2004/0129990 A1 | 7/2004 | Lee | |
| 2004/0169127 A1 | 9/2004 | Ohkawa | |
| 2005/0006676 A1 | 1/2005 | Watanabe | |
| 2005/0040393 A1 * | 2/2005 | Hong | 257/40 |
| 2005/0121733 A1 * | 6/2005 | Chen et al. | 257/408 |

* cited by examiner

*Primary Examiner*—Eugene Lee
(74) *Attorney, Agent, or Firm*—Dickstein Shapiro LLP

(57) ABSTRACT

An imager having gates with spacers formed of a high dielectric material. The high dielectric spacer provides larger fringing fields for charge transfer and improves image lag and charge transfer efficiency.

10 Claims, 13 Drawing Sheets

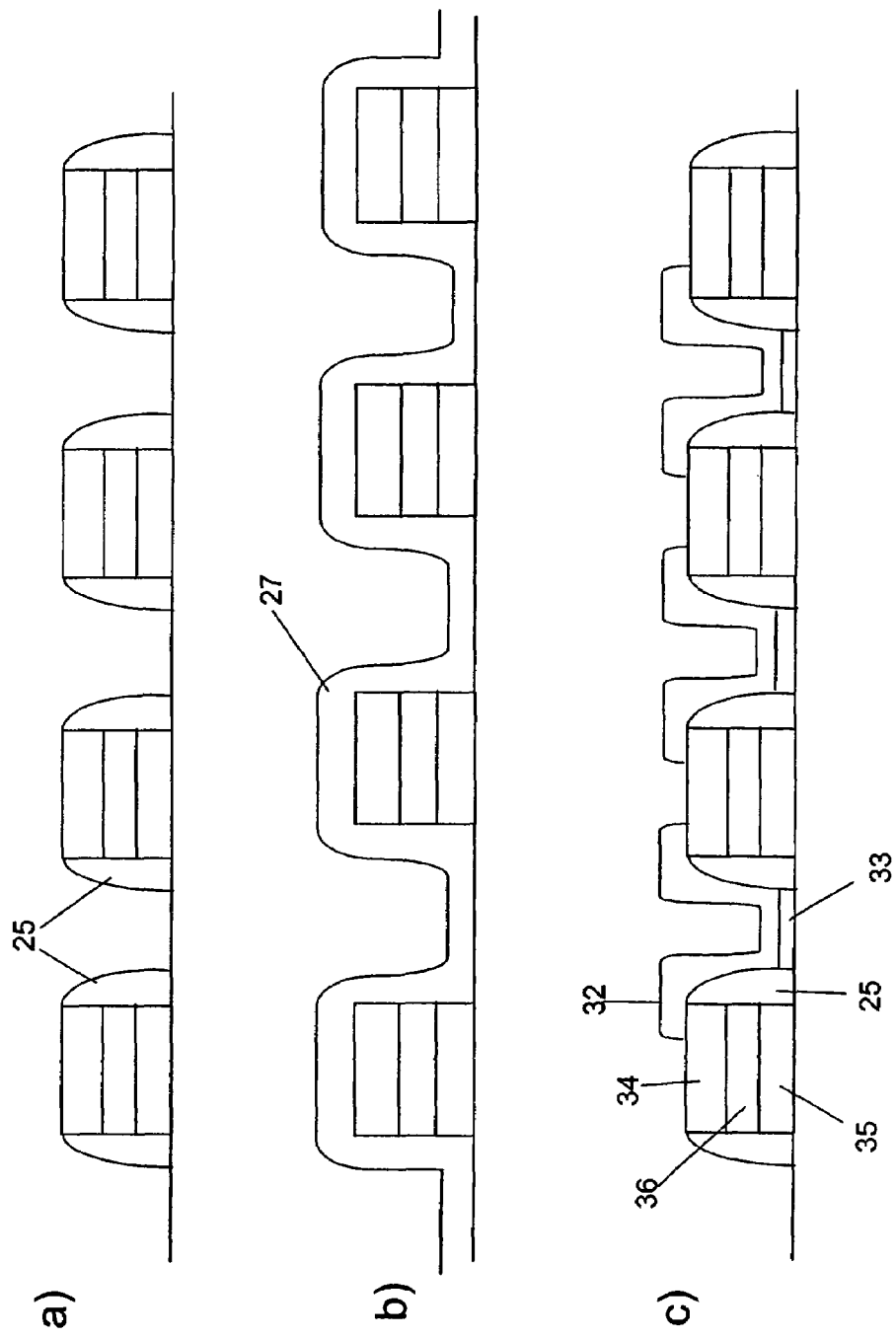

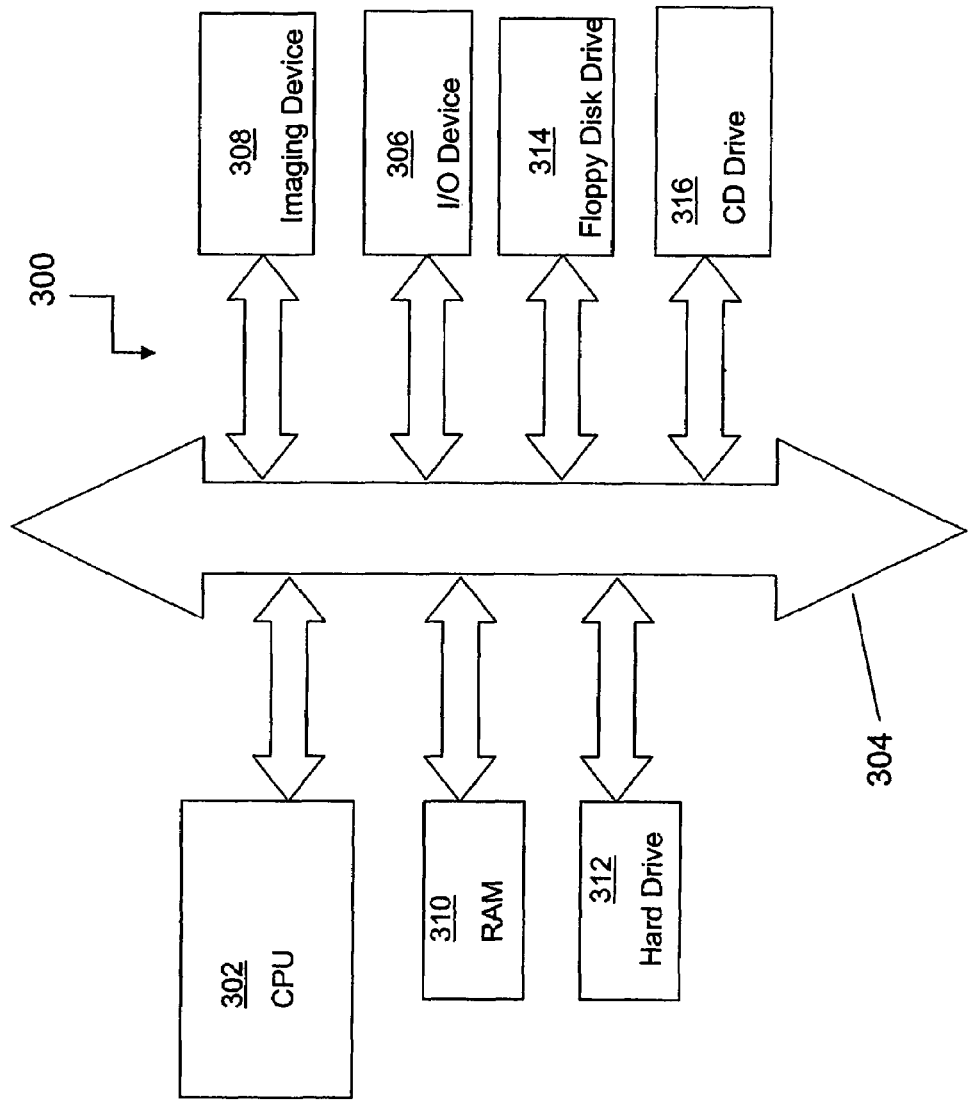

HIGH DIELECTRIC CONSTANT SPACER FOR IMAGERS

This is a divisional application of U.S. patent application Ser. No. 10/865,762, filed on Jun. 14, 2004, now abandoned the entire disclosure of which is incorporated by reference herein.

FIELD OF THE INVENTION

The invention relates generally to a method and apparatus relating to a pixel array of an imager. In particular, the invention relates to imagers having pixels with an improved gate structure.

BACKGROUND

Typically, a digital imager array includes a focal plane array of pixel cells, each one of the cells including a photoconversion device, e.g. a photogate, photoconductor, or a photodiode. In a CMOS imager a readout circuit is connected to each pixel cell which typically includes a source follower output transistor. The photoconversion device converts photons to electrons which are typically transferred to a floating diffusion region connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing patents are hereby incorporated by reference in their entirety.

FIG. 1 illustrates a block diagram of an exemplary CMOS imager device 308 having a pixel array 200 with each pixel cell being constructed as described above. Pixel array 200 comprises a plurality of pixels arranged in a predetermined number of columns and rows (not shown). The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel. The CMOS imager is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. A differential signal ($V_{rst}-V_{sig}$) is produced by differential amplifier 262 for each pixel which is digitized by analog-to-digital converter 275 (ADC). The analog-to-digital converter 275 supplies the digitized pixel signals to an image processor 280, which forms a digital image.

In a digital CMOS imager, when incident light strikes the surface of a photoconversion device, e.g., a photodiode, electron/hole pairs are generated in the p-n junction of the photodiode. The generated electrons are collected in the n-type region of the photodiode. The photo charge moves from the initial charge accumulation region to the floating diffusion region or it may be transferred to the floating diffusion region via a transfer transistor. The charge at the floating diffusion region is typically converted to a pixel output voltage by a source follower transistor (described above).

Image lag can be a problem for imagers, whether the imager is a CMOS, CCD or other type of imager. Image lag can occur, for example, in CMOS image sensor pixels using transfer transistors to transfer charge from the photodiode to the floating diffusion region. There is a potential barrier corresponding to the photodiode/transfer gate region. If this potential barrier is too high, a portion of the charge will be unable to move from the photodiode to the floating diffusion region. The greater the potential barrier, the less charge will be transferred to the floating diffusion region. A potential barrier in the photodiode/transfer gate region may cause incomplete charge transfer reducing the charge transfer efficiency (CTE) of the pixel cell. Charge remaining in the photodiode from a prior image can affect a subsequent image, causing image lag, where a ghost image from the initial charge is apparent in a subsequent image.

Fringing fields improve charge transfer from a photoconversion device, e.g. a photodiode, to a charge collection region. Conventional imagers typically utilize low dielectric (K) oxide spacers for transistor gates, which create smaller fringing fields. A larger fringing field in, for example, a transfer gate of a CMOS imager would improve charge transfer from the photodiode to the floating diffusion region. This would thereby reduce image lag because more carriers are transferred. In CCD imagers, larger fringing fields improve charge transfer efficiency (CTE) in addition to improving image lag characteristics.

CCD devices that use overlapping polysilicon 1 and polysilicon 2 electrodes achieve a high fringing field by applying high voltages to the polysilicon electrodes. This is not desirable on CMOS imagers which are advantageously low voltage devices so they will compatible with CMOS logic circuit and devices. Another imager device, the single polysilicon CCD imager does not have overlapping polysilicon electrodes and could also benefit from a method to achieve high fringing fields to achieve improved charge transfer. Thus, there is a desire and need to increase fringing fields and thereby improve charge transfer and reduce image lag in imager devices.

SUMMARY

Embodiments of the invention provide an imager having gates with spacers formed of a high dielectric constant material. The high dielectric spacers provide larger fringing fields for charge transfer and also improve image lag and charge transfer efficiency.

DESCRIPTION OF THE DRAWINGS

Additional features of the present invention will be apparent from the following detailed description and drawings which illustrate exemplary embodiments of the invention, in which:

FIGS. 12a, 12b and 12c are cross-sectional views of a portion of a pixel of an image sensor according to another embodiment of the invention; and FIG. 13 is a schematic diagram of a processing system employing an imager constructed in accordance with any of the various embodiments of the present invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device and associated transistors for converting photons to an electrical signal. For purposes of illustration, a single representative pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Figure 2:
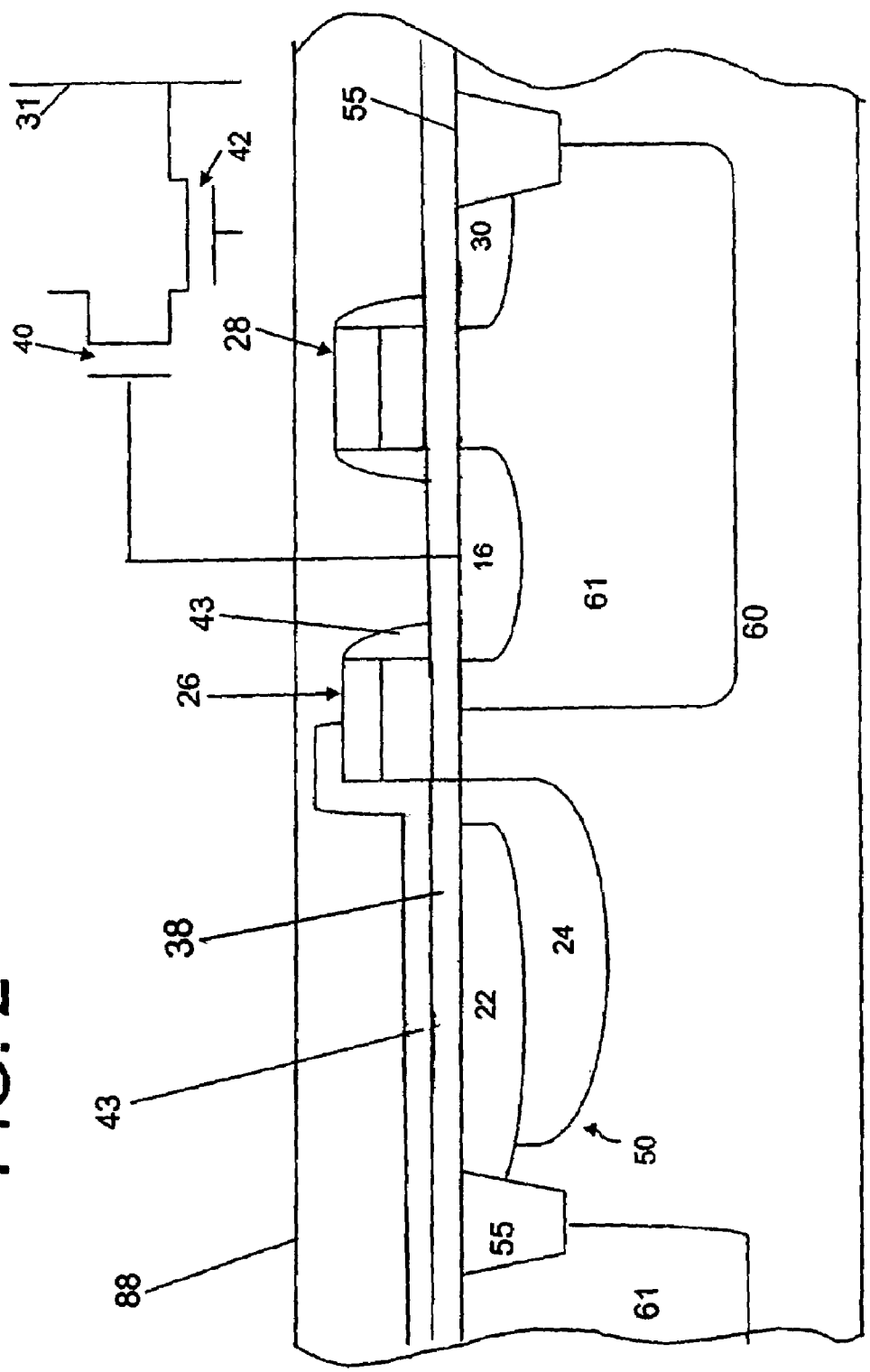
FIG. 2 is a cross-sectional view of a portion of a pixel of an image sensor according to an embodiment of the invention.

In the following description, the invention is described in relation to CMOS and CCD imagers for convenience; however, the invention has wider applicability to other solid state imagers. Now referring to the figures, where like reference numbers designate like elements, FIG. 2 illustrates a pixel sensor cell of a CMOS imager constructed in accordance with a first exemplary embodiment of the invention. A photoconversion device 50 is formed in a substrate 60 having a doped layer or well 61, which for exemplary purposes is a p-type well. The illustrated photoconversion device 50 is a photodiode and may be a p-n junction photodiode, npn photodiode, a photoconductor, a Schottky photodiode, or any other suitable photodiode, but for exemplary purposes is discussed as a p-n-p photodiode. In addition and for exemplary purposes only, substrate 60 is a p-type substrate and well 61 is a p-type well.

The illustrated photodiode 50 consists of a p+ region 22 and an n-type region 24. The remaining structures shown in FIG. 2 include a transfer transistor with associated gate 26 and a reset transistor with associated gate 28. Floating diffusion region 16, source/drain region 30 and shallow trench isolation (STI) regions 55 are also shown. A source follower transistor 40 and row select transistor 42 with associated gates are also included in the pixel sensor cell, but are depicted in electrical schematic form with the output of the row select transistor 40 being connected with a column line 31. Although shown in FIG. 2 as a four-transistor (4T) configuration with a transfer transistor and associated gate 26, the invention can also be utilized in a three-transistor (3T) configuration, without a transfer transistor, and in pixels with other transistor configurations (e.g., 2T, 5T, 6T, 7T, etc.).

In the exemplary embodiment shown in FIG. 2, a high dielectric constant material is used for the spacer layers 43 of the transfer transistor and associated gate 26. Although shown in this embodiment as being utilized in association with a transfer transistor, the high dielectric constant spacers may be used as spacer material for any other transistor in the image sensor. Any suitable material having a high dielectric constant may be used for the spacer layer 43. The spacer material should be an insulator material and should have a dielectric constant higher than silicon dioxide. Examples of high dielectric constant materials which may be used to form the spacer layer 43 are materials having a dielectric constant of greater than 3.9, and including but not limited to, aluminum oxide ($Al_2O_3$), hafnium oxide ($HfO_2$), tantalum oxide ($Ta_2O_5$), barium strontium titanate (($BaSr)TiO_3$ also known as BST) and silicon nitride ($Si_3N_4$).

FIGS. 3-10 show one exemplary method of forming a pixel sensor cell with a high dielectric constant spacer of FIG. 2 of the invention at various stages of formation. For convenience, the same cross-sectional view of FIG. 2 is utilized in FIGS. 3-10 for the ensuing description. In addition, for clarity purposes, the source follower and row select transistors 40, 42 (FIG. 2) are not illustrated but it should be appreciated that they are present in the final pixel sensor cell.

Figure 3:
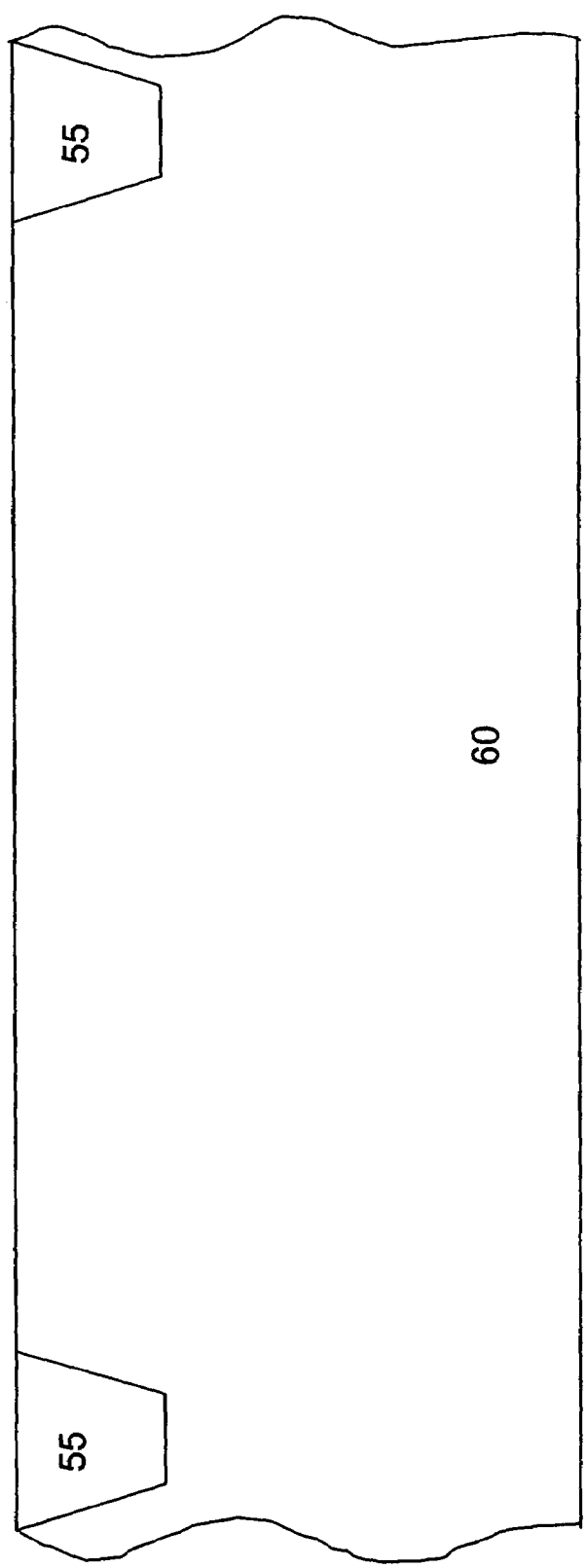
FIG. 3 shows a cross-sectional view of a portion of the FIG. 2 photodiode during an initial stage of processing performed in accordance with a method of the invention.

Referring to FIG. 3, first a p-type silicon substrate 60 is provided. Isolation regions 55 are formed to electrically isolate regions of the substrate where pixel cells will later be formed. The isolation regions 55, can be formed by any known technique such as thermal oxidation of the underlying silicon in a LOCOS process, or by etching trenches and filling them with oxide in an STI (shallow trench isolation) process.

Figure 4:
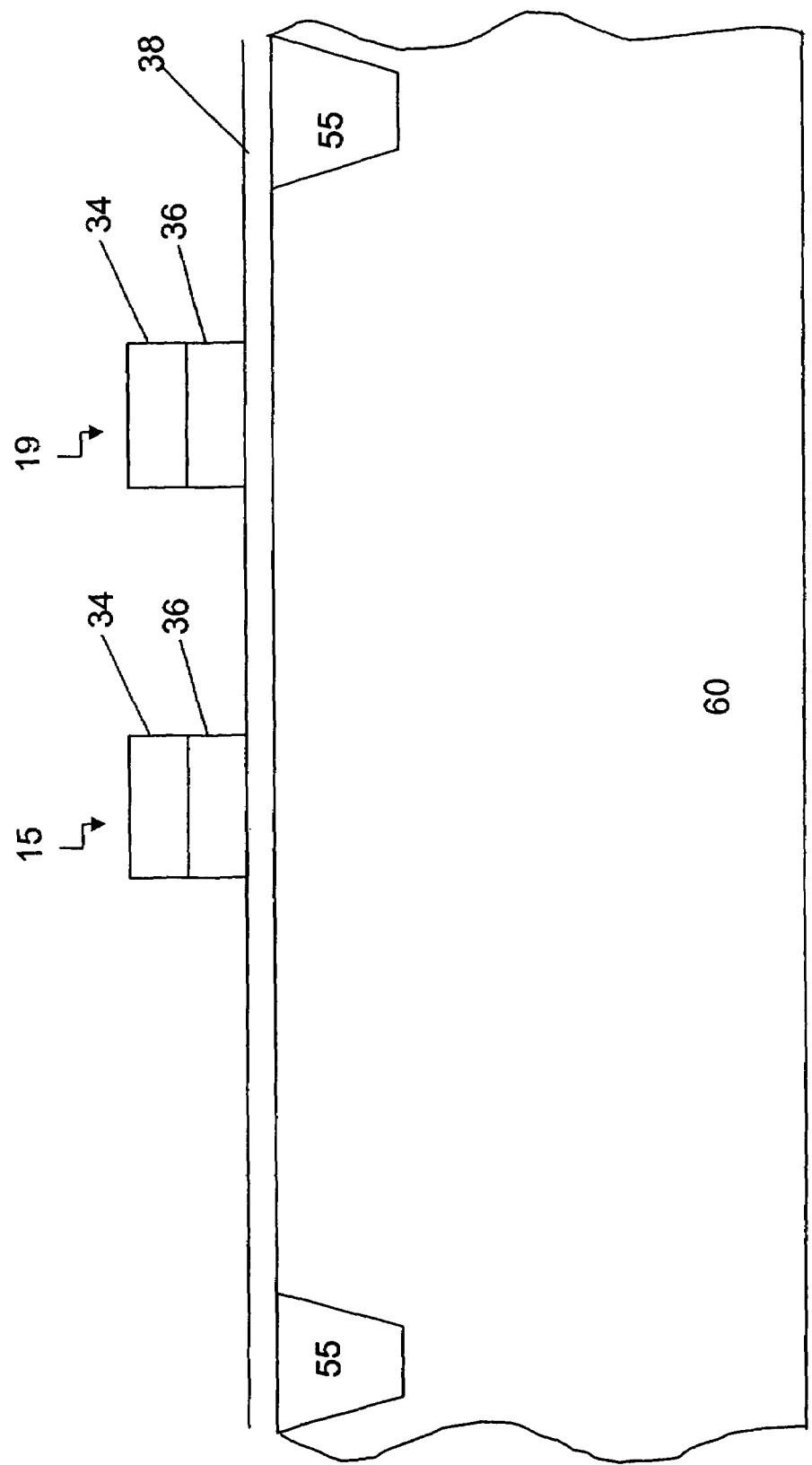
FIG. 4 shows a stage of processing subsequent to that shown in FIG. 3.

FIG. 4 shows a blanket deposition of a gate oxide layer 38 over substrate 60. FIGS. 4-9 show the formation of one exemplary gate stack 15 for a transfer transistor which has high dielectric constant (high K) spacers according to an embodiment of the invention. However, more than one gate stack with high K spacers constructed according to the invention may also be formed. For example, embodiments of the invention may be employed on storage transistors, high dynamic range transistors, source follower transistors, row select transistors or global shutter transistors. Gate stacks 15 and 19 are formed over gate oxide layer 38 by conventional methods and have an insulator layer 34 and conductor layer 36. Conductor layer 36 may be formed of any conductive material and insulator layer 34 may be formed of any insulating material known in the art. The conductor 36 is, for example, poly, polysilicide, poly/WSi$x_2$, poly TiSi$_2$, poly/WNx/W. The insulator layer may be oxide or a high K material or a sandwich structure of these insulators. The insulator layer 34 is not required.

Figure 5:
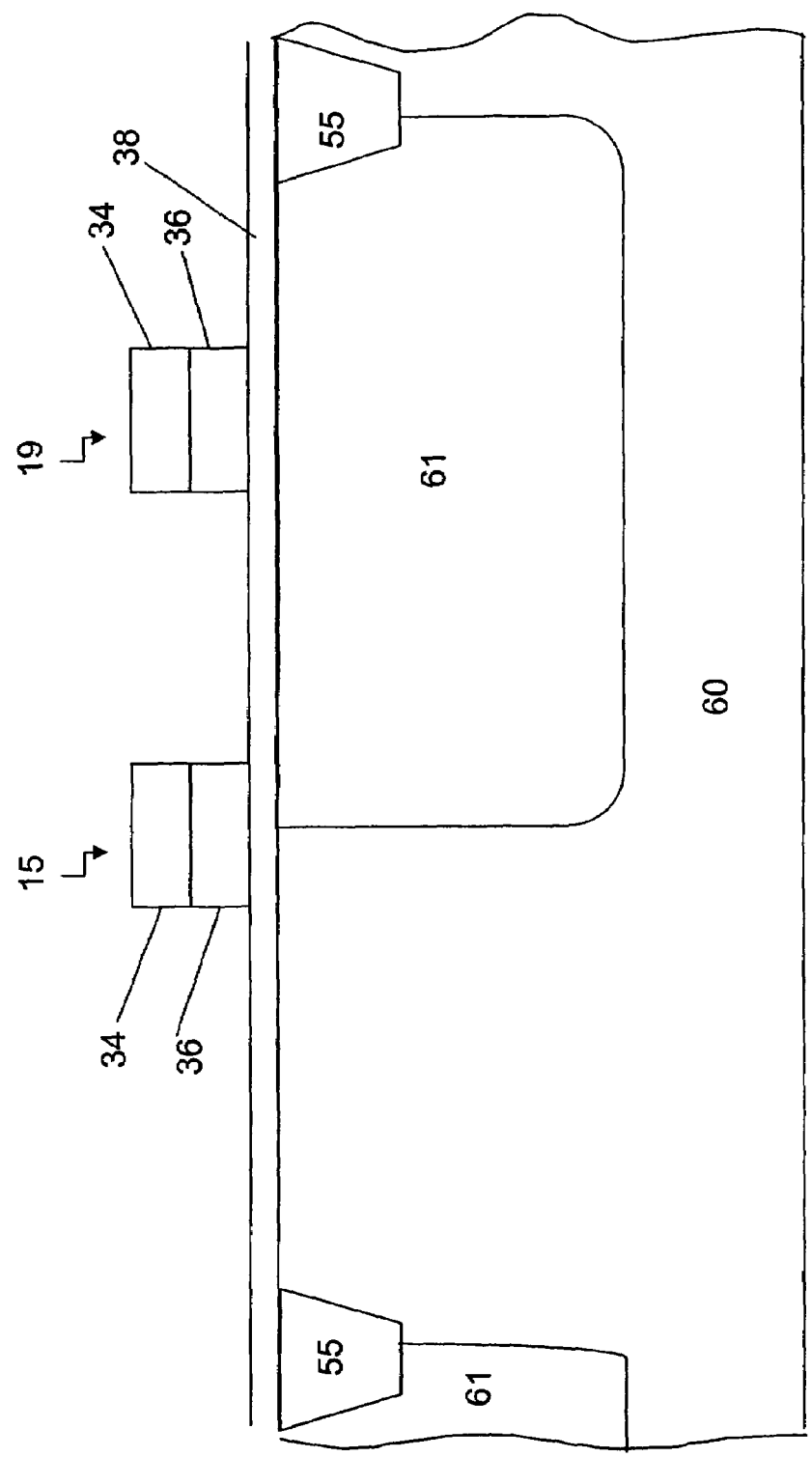
FIG. 5 shows a stage of processing subsequent to that shown in FIG. 4.

As shown in FIG. 5, if the p-type well 61 has not yet been formed, it may be formed by blanket implantation or by masked implantation. P-type well 61 may be formed before or after the formation of isolation regions 55 and gate stack 15. The p-well implant may be conducted so that the pixel array well 61 and a p-type periphery logic well, which will contain logic circuits for controlling the pixel array, have different doping profiles. As known in the art, multiple high energy implants may be used to tailor the profile and position of the p-type well 61. The p-type well shown in FIG. 5 is shown as a p-type well formed using a masked ion implantation.

Figure 6:
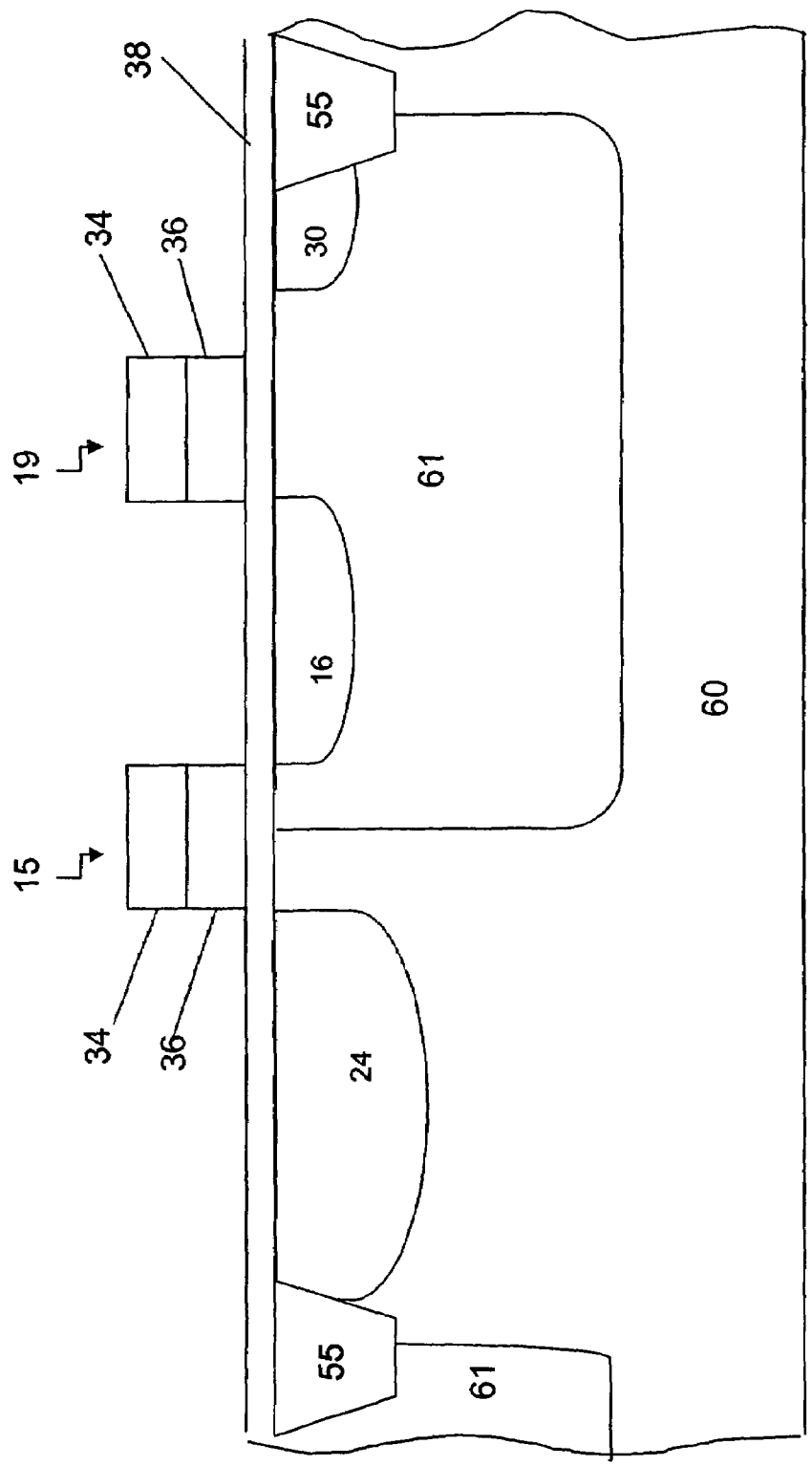
FIG. 6 shows a stage of processing subsequent to that shown in FIG. 5.

Formed floating diffusion region 16 and source/drain region 30 are depicted in FIG. 6. The doped regions 16, 30 are formed in the p-well 61 and are doped to an n-type conductivity in this embodiment. For exemplary purposes, regions 16, 30 are n+ doped to form an n-channel gate transistor, however, regions 16 and 30 may also be p-type doped to form a p-channel gate transistor. Regions 16, 30 may be formed by applying a mask to the substrate and doping the regions 16, 30 by ion implantation. FIG. 6 also shows n-type implantation of region 24 by methods known in the art. Doped region 16 could also be a n-implanted region.

Figure 7:
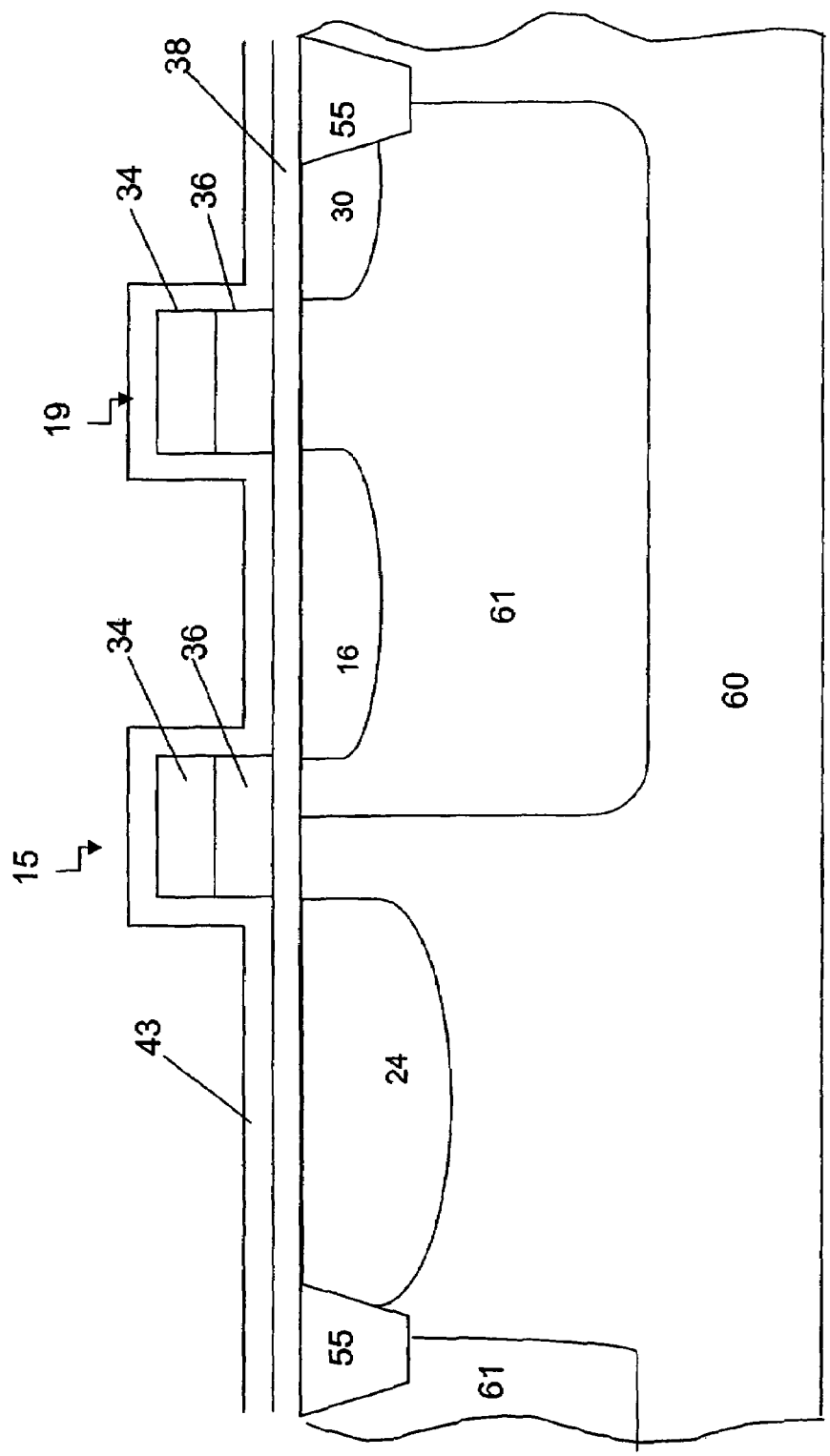
FIG. 7 shows a stage of processing subsequent to that shown in FIG. 6.

FIG. 7 shows the deposition of a high K dielectric layer 43 over gate stacks 15, 19 and gate oxide layer 38. Layer 43 may be formed of any material having high dielectric constant properties, including for example, aluminum oxide ($Al_2O_3$), hafnium oxide ($HfO_2$), silicon nitride ($Si_3N_4$), tantalum oxide ($Ta_2O_5$), and barium strontium titanate (($BaSr)TiO_3$). A dual high dielectric constant material spacer may also be used. The thickness of the high K dielectric layer 43 may be in the range of about 100 Å to about 1500 Å, preferably in the range of about 200 Å to about 800 Å. A high dielectric constant material used on the spacers of a transistor, in this embodiment a transfer transistor, creates a larger fringing field in the gate channel of the transistor. The larger fringing field produced by the high dielectric constant spacer on the transfer transistor gate 26 improves charge transfer from the photodiode 50 to the floating diffusion region 16 and reduces image lag.

Figure 8:
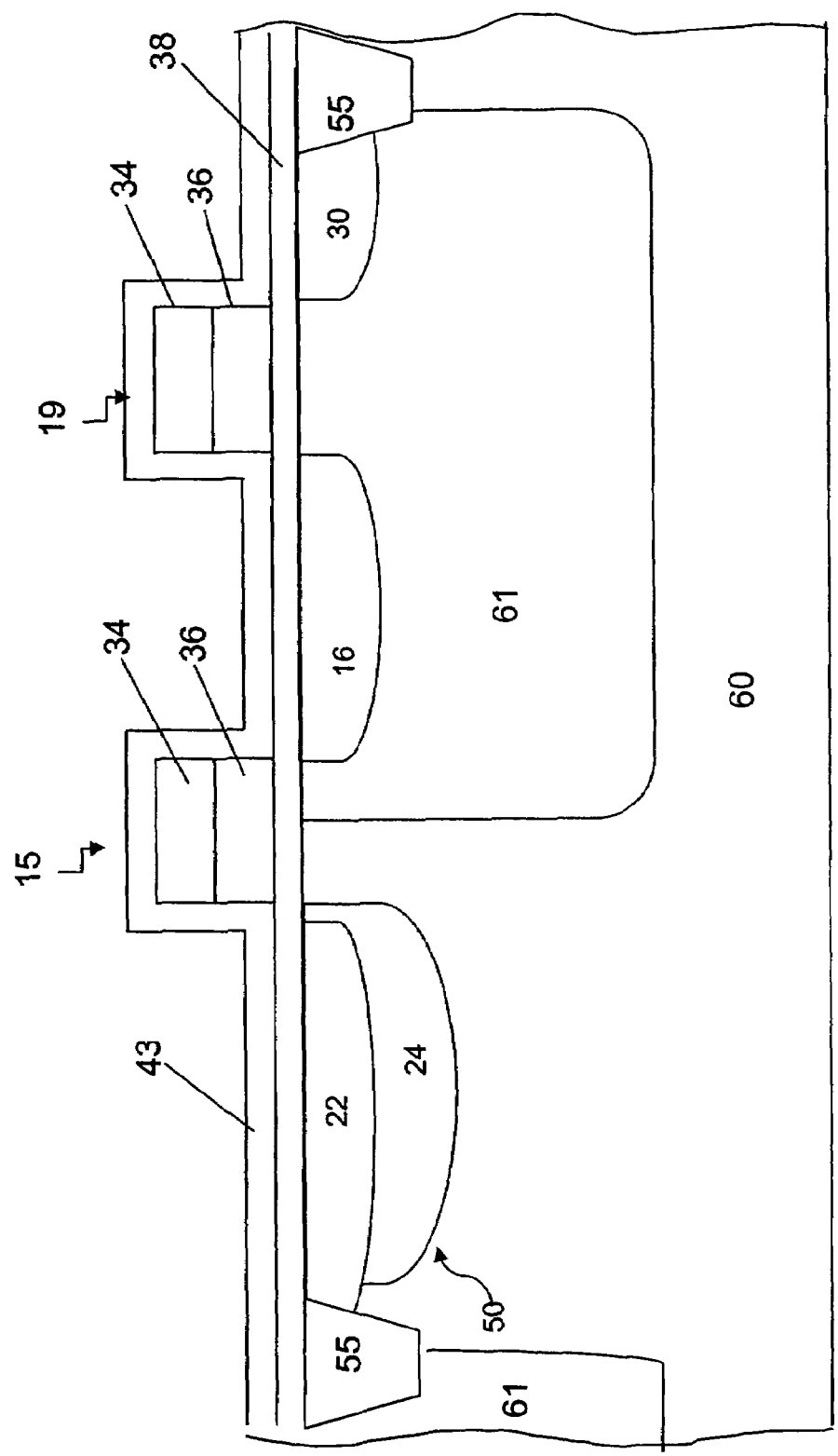
FIG. 8 shows a stage of processing subsequent to that shown in FIG. 7.
Figure 9:
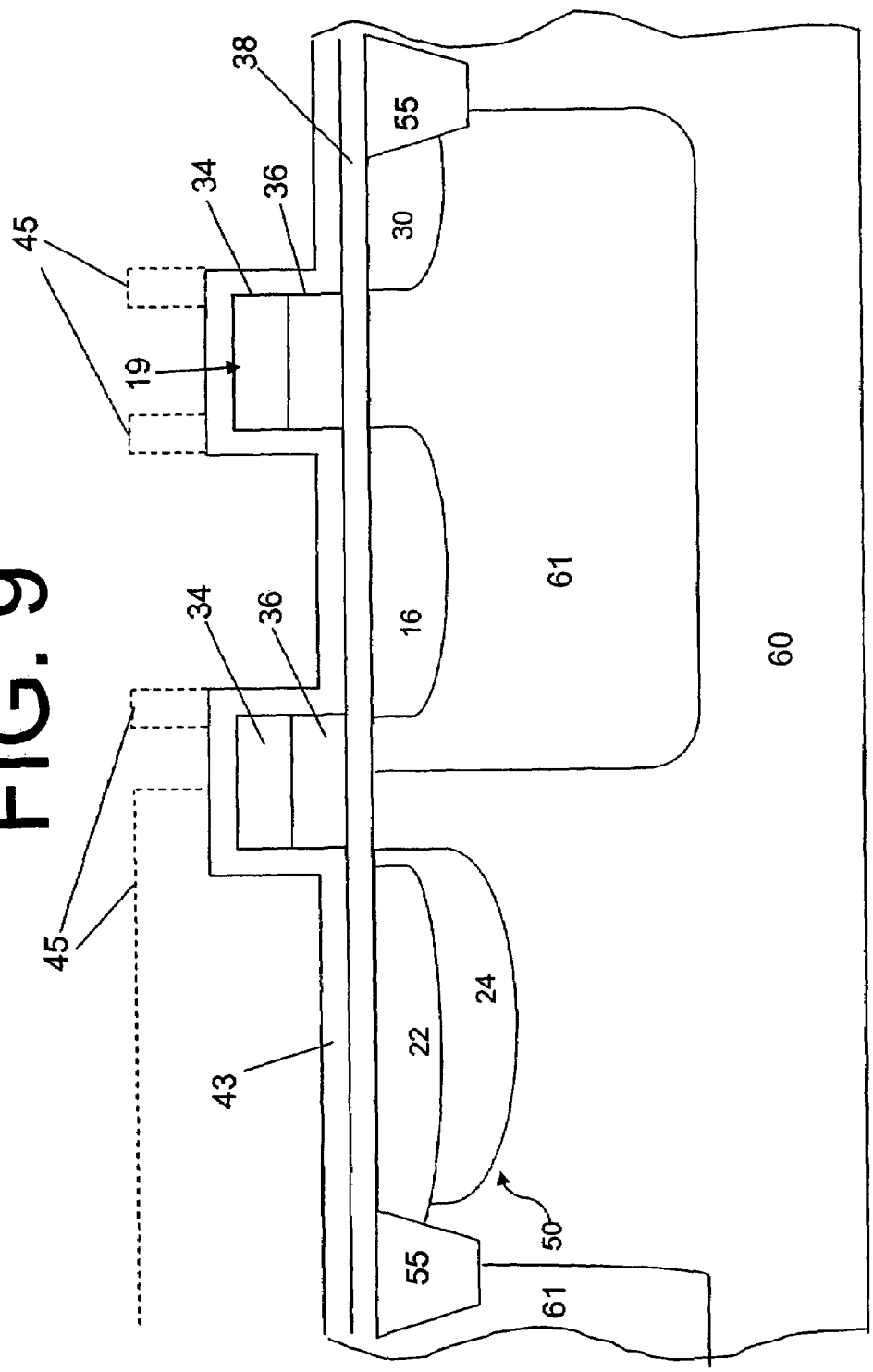
FIG. 9 shows a stage of processing subsequent to that shown in FIG. 8.
Figure 10:
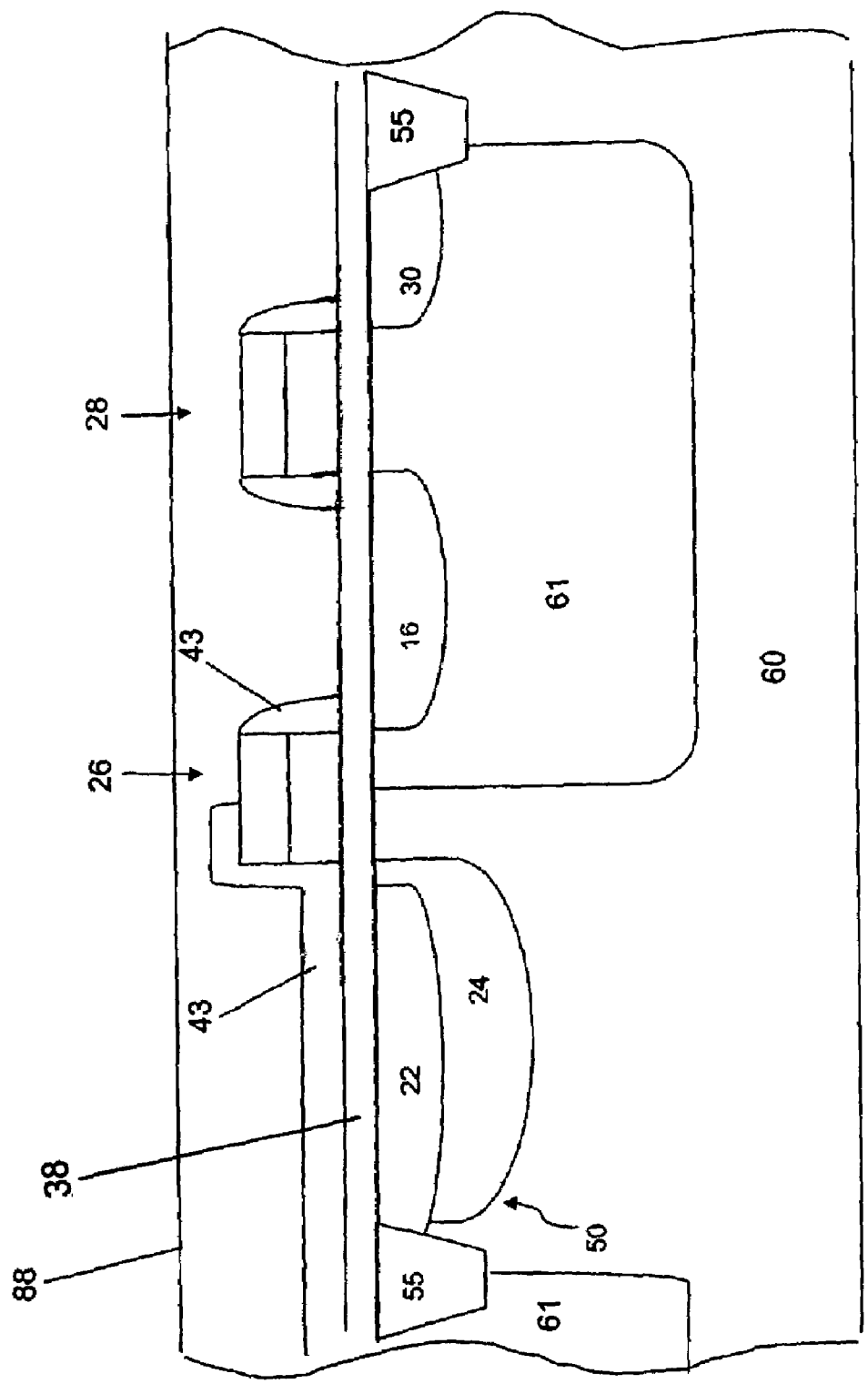
FIG. 10 shows a stage of processing subsequent to that shown in FIG. 9.

FIG. 8 shows implantation of p-type region 22 of photodiode 50. The implantation of p-type region 22 may occur by methods known in the art. A masked spacer etch with mask 45, as illustrated in FIG. 9, is performed to remove the high dielectric constant material, except for areas covered by mask 45, including a portion of gate stacks 15, 19 on one side and on a sidewall of gate stacks 15, 19 on the opposite side. The masked spacer etch step leaves areas of the transfer transistor and associated gate 26 and a sidewall covered with the high dielectric constant layer 43, as shown in FIG. 10. Although described above in conjunction with FIGS. 9 and 10 as a masked spacer etch step, the spacer etch could also be performed without a mask 45. FIG. 10 also shows a formed reset transistor and associated gate 28.

The reset transistor or any other transistor may also be formed with or without a high dielectric constant spacers. Alternatively, some transistors of a pixel sensor cell may be formed with a high dielectric constant spacers, while other transistors of the same pixel sensor cell may be formed according to conventional methods with conventional spacers known in the art. In addition, although described above in reference to a CMOS image sensor, the method of forming a gate stack having a high dielectric constant spacer may also be performed on other types of imagers such as for example, a charge coupled device (CCD).

The pixel sensor cell is essentially complete at this stage, and conventional processing methods may be used to form insulating, shielding, and metallization layers to connect gate lines and other connections to the pixel sensor cells. For example, the entire surface may be covered with a passivation layer 88 of, for example, silicon dioxide, BSG, PSG, or BPSG, which is CMP planarized and etched to provide contact holes, which are then metallized to provide contacts. Conventional layers of conductors and insulators may also be used to interconnect the structures and to connect the pixel to peripheral circuitry.

Figure 11:
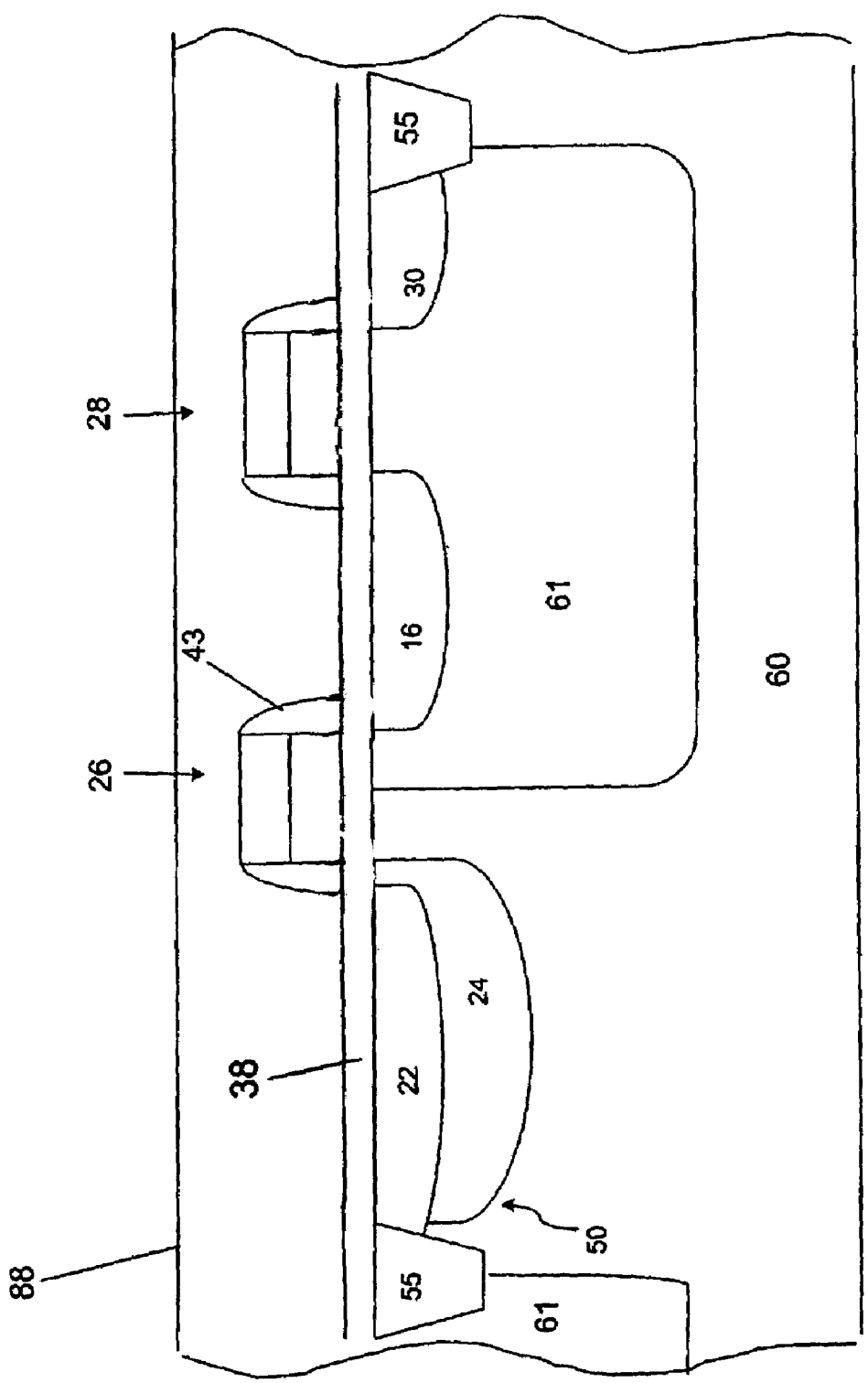
FIG. 11 is a cross-sectional view of a portion of a pixel of an image sensor according to another embodiment of the invention.

FIG. 11 shows another embodiment of the invention which is similar to the embodiment described above in relation to FIGS. 3-10 except that a blanket spacer etch step is used to remove the dielectric layer 43, rather than the masked step shown above in FIG. 9.

FIG. 12*a-c* show embodiments of the invention as applied to a CCD imager. For simplicity, only the transistors are shown. FIGS. 12*a* and 12*b* depict a single gate CCD imager with a vertical or horizontal shift register. In the embodiment of FIG. 12*a*, the high dielectric material is employed as spacers 25, as described above in relation to FIGS. 3-10 except that a blanket spacer etch step is used to remove the dielectric layer 43, rather than the masked step shown above in FIG. 9. FIG. 12*b* shows a single gate CCD imager having high dielectric material as sidewalls 27.

FIG. 12*c* shows an embodiment according to the invention having an overlapping gate 32 between two transistor gates on a CCD imager. The embodiment of FIG. 12*c* has a first gate oxide layer 35 and a second gate oxide layer 33. High dielectric constant spacers 25 are formed as described above in reference to FIGS. 3-10 with the exception of a blanket spacer etch step instead of the masked step shown in FIG. 9. The gate stacks also have a conductive layer 36 and an insulator layer 34, as described above.

Figure 1:
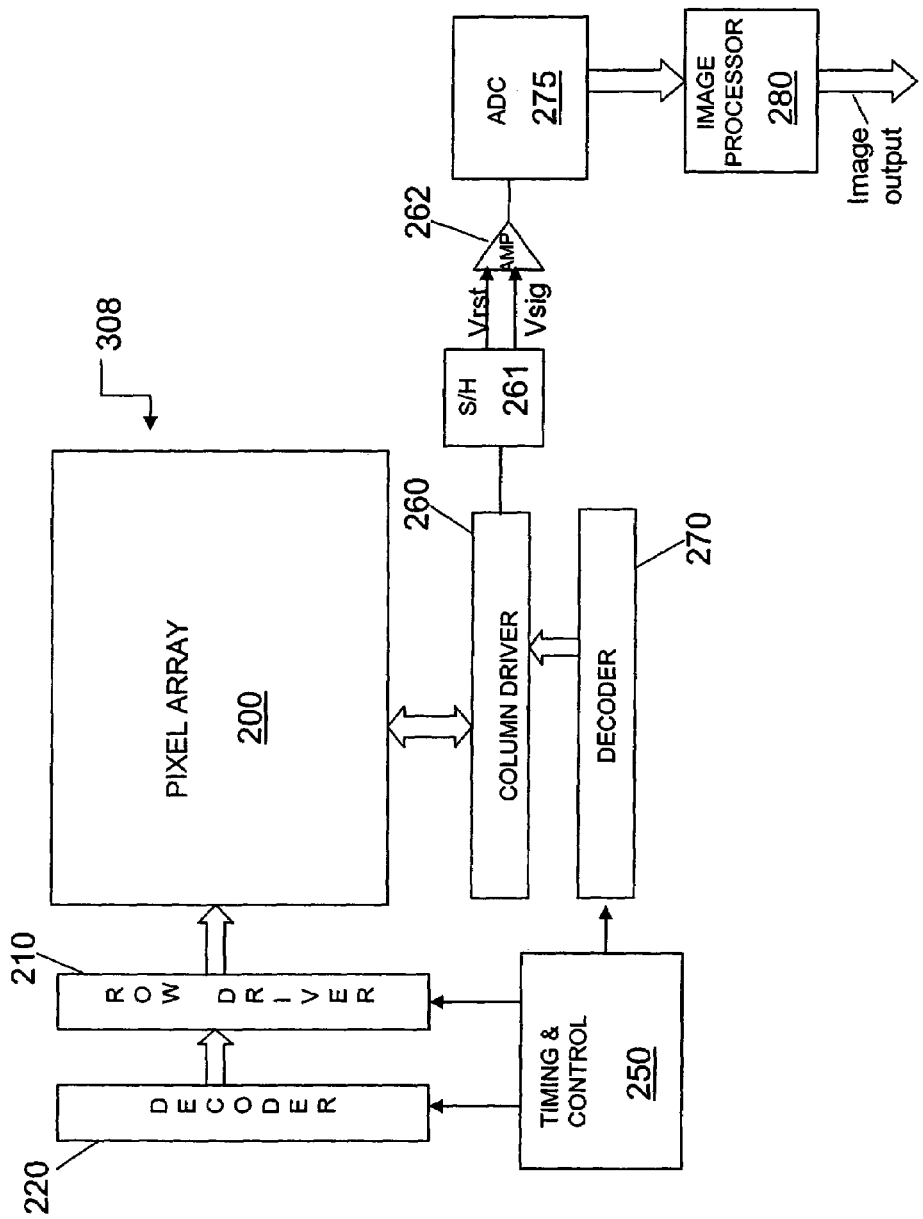
FIG. 1 is a block diagram of a conventional imager device having a pixel array.

FIG. 13 shows a processor system 300, which includes an imager device 308 (FIG. 1) constructed in accordance with an embodiment of the invention; that is, the imager device 308 uses a pixel array having pixels constructed in accordance with the various embodiments of the invention. The imager device 308 may receive control or other data from system 300. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 with the pixel array 200 having the characteristics of the invention as described above in connection with FIGS. 2-12. The invention provides an imager having gates with spacers formed of a high dielectric material. The high dielectric spacers provide larger fringing fields for charge transfer and also improve image lag and charge transfer efficiency. The imager device 308 may, in turn, be coupled to processor 302 for image processing, or other image handling operations.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A method of forming a charge coupled device comprising:
   forming adjacent first and second transistors, with respective first and second gate stacks, over at least a portion of a substrate;
   forming a first spacer element formed of a high dielectric constant material over at least one sidewall region of the first gate stack;
   forming a second spacer element formed of a high dielectric constant material over at least one sidewall region of the second gate stack;
   forming an insulator element between and in contact with the first and second spacer elements, the insulator element having a bottommost surface substantially planar to a bottommost surface of the first and second spacer elements; and
   forming an overlapping gate over and in contact with the first and second spacer elements.

2. The method of claim 1, wherein at least one of the first and second spacer elements has a cross-sectional thickness of about 100 Å to about 1500 Å.

3. The method of claim 2, wherein at least one of the first and second spacer elements has a cross-sectional thickness of about 200 Å to about 600 Å.

4. The method of claim 1, wherein at least one of first and second spacer elements is made of a material selected from the group consisting of aluminum oxide, hafnium oxide, tantalum oxide, and barium strontium titanate.

5. The method of claim 1, wherein at least one of the first and second spacer elements is formed by:
   depositing a spacer element precursor,
   forming a mask over selected portions of the spacer element precursor,
   and removing exposed portions of the spacer element precursor not having a mask formed thereover.

6. The method of claim 1, further comprising forming an oxide layer between the first and second spacer elements and below the overlapping gate.

7. The method of claim 6, wherein the oxide layer is formed of a material that is different from at least one of the first and second spacer elements.

8. The method of claim 1, wherein at least one of the first and second gates comprises:
   an oxide layer;
   a conductive layer formed over the oxide layer; and
   an insulator formed over the conductive layer, wherein the insulator is in contact with the overlapping gate.

9. A method of forming an integrated circuit comprising:
   forming an imager having at least one pixel cell by:
      doping selected portions of a semiconductor substrate;
      forming at least two adjacent gate stacks in association with the doped selected portions;
      forming a high dielectric constant material over all exposed portions of the substrate and the at least two adjacent gate stacks;
      selectively removing portions of the high dielectric constant material from over the substrate and from over upper surfaces of the at least two adjacent gate stacks to form respective spacers over at least a portion of each of the gate stacks;
      forming an insulator between and in contact with the respective spacers, the insulator having a bottommost surface substantially planar to a bottommost surface of the respective spacers; and
      forming an overlapping gate over the spacers and insulator, wherein the overlapping gate is in contact with at least two spacers, each spacer being in contact with a respective different gate stack.

10. The method of claim 9, further comprising forming a mask over selected portions of the high dielectric constant material and removing exposed portions of the high dielectric constant material not having a mask formed thereover.

* * * * *